United States Patent [19]

Shumaker

[11] Patent Number: 4,600,904
[45] Date of Patent: Jul. 15, 1986

[54] BROKEN LOOP SWITCHED CAPACITOR HIGH PASS FILTER

[75] Inventor: Wayne G. Shumaker, Westboro, Mass.

[73] Assignee: Motorola, Inc., Schaumburg, Ill.

[21] Appl. No.: 625,422

[22] Filed: Jun. 28, 1984

[51] Int. Cl.$^4$ .............................................. H03H 11/12
[52] U.S. Cl. ..................................... 333/173; 333/214
[58] Field of Search ............... 333/173, 214, 213, 167, 333/172; 328/167; 330/9, 51, 109, 107; 364/825, 725

[56] References Cited

U.S. PATENT DOCUMENTS

| | | | |
|---|---|---|---|
| 1,557,036 | 10/1925 | Elsasser | 333/168 |
| 1,951,025 | 3/1934 | Levine | 333/168 X |
| 3,835,399 | 9/1974 | Holmes | 328/167 |
| 4,168,440 | 9/1979 | Gray | 328/167 X |
| 4,210,872 | 7/1980 | Gregorian | 330/9 |
| 4,315,229 | 2/1982 | Greaves et al. | 328/167 X |

FOREIGN PATENT DOCUMENTS 0015343  9/1980  European Pat. Off. ............ 333/173
57-97715(A) 6/1982  Japan .

OTHER PUBLICATIONS

Pandel, J. and Dawei H.; "Novel Realization of Floating Voltage Inverter Switches & Inductances for Switched Capacitor Filter"; 15th Conf. on Circuits, Systems & Computers; Pacific Gr., Ca., pp. 293-297.

MOS Switched Capacitor Ladder Filters; D. J. Allstot, R. W. Brodersen, P. R. Gray, IEEE Journal of Solid State Circuits; vol. SC-13, No. 6; 12/1978.

Design Techniques for MOS Switched Capacitor Ladder Filters; G. M. Jacobs, D. J. Allstot, R. W. Brodersen, P. R. Gray; IEEE Transactions on Circuits and Systems; vol. CAS-25, No. 12; 12/1978.

Switched Capacitor Filter Design Using the Bilinear Z-Transform; G. C. Temes, H. J. Orchard, M. Jahanbegloo; IEEE Transactions on Circuits and Systems; vol. CAS-25, No. 12; 12/1978.

MOS Switched Capacitor Filters; R. W. Brodersen, P. R. Gray, D. A. Hodges; Proceedings of the IEEE; vol. 67, No. 1; 1/1979.

A Sampled Data Active Filter for PCM Telecommunications Systems; T. Suzuki and K. Yamakido; Proceedings of 1979 ISCAS.

A Prewarping Scheme for the Design of Switched-Capacitor Filters; U. W. Brugger and B. S. Hosticka; IEEE International Symposium on Circuits and Systems; 1980.

Effects of the Op AMP Finite Gain and Bandwidth on the Performance of Switched Capacitor Filters; K. Martin and A. S. Sedra; IEEE International Symposium on Circuits and Systems; 1980.

MOS Switched Capacitor High Pass/Notch Ladder Filters; T. Hui and D. J. Allstot; IEEE International Symposium on Circuits and Systems; 1980.

Bilinear Switched-Capacitor Filters; M. S. Lee, G. C. Temes, C. Chang; M. B. Ghader; IEEE Transactions on Circuits and Systems; vol. CAS-28, No. 8, 8/1981.

L. T. Bruton, Low Sensitivity Digital Ladder Filters, IEEE Transactions on Circuits and Systems, vol. CAS-22, No. 3, Mar. '75, pp. 168–176.

K. R. Laker: Equivalent Circuits for the Analysis and Synthesis of Switched Capacitor Networks; Bell System Technical Journal; vol. 58, No. 3, Mar. 1979; pp. 728–769.

Primary Examiner—Eugene R. LaRoche
Assistant Examiner—Benny Lee
Attorney, Agent, or Firm—James W. Gillman; Raymond A. Jenski

[57] ABSTRACT

A switched-capacitor high pass filter is disclosed and in which a switched capacitor approximation of an inductor is inserted in the direct coefficient loop to prevent instability. The value of the inductor is selected to compensate for the filter termination phase error.

2 Claims, 13 Drawing Figures

PRIOR ART

*Fig. 1*

PRIOR ART

*Fig. 2a*

PRIOR ART

BROKEN LOOP SWITCHED CAPACITOR HIGH PASS FILTER

BACKGROUND OF THE INVENTION

This invention relates generally to filter network and more specifically to a switched capacitor high pass filter in which the instantaneous coupling loop between input and output is interrupted.

The need to miniaturize filters has led designers to search for filter techniques compatable with integrated circuits. Initially, monolithic operational amplifiers were used in resistor-capacitor (RC) feedback networks which provided good performance without substantial size reduction. These networks have resisted inclusion into monolithic form due to the difficulty in achieving precise RC values in the monolitic process.

For filters in the audio and supra-audio frequencies, where long time constants in small semiconductor areas are required, sampled data techniques employing MOS transistors have become useful. Switched capacitor sampled data circuits utilize the fact that when a capacitor is switched between a signal to be sampled and a voltage amplifier at a frequency many times the frequency of the sampled signal it will simulate the circuit behavior of a resistor. The switched capacitor, in a proper circuit arrangement, can also be used as an integrator. Workers in the field have implemented sampled-data versions of second order (biquad) active filters using switched capacitors to simulate resistors. However, higher order filters realized by cascading these second order sections exhibit a sensitivity to component variation which preclude their use in high-precision filter applications.

High order precision filters have been achieved using "active ladder" or "leap frog" sampled data filters which have very low sensitivity to component variation in relation to cascade filters when the clock frequency is high. The low sensitivity of these filters is also nearly independent of sampling frequency, thereby permitting the use of clock frequencies many times higher than the passband frequency and reducing the requirements of the antialiasing prefilter. These filters become more sensitive at lower clock frequencies when the switched capacitor approximations exhibit large phase errors in the integrators. In addition, this type of filter can be organized so that there is a close correspondence between it and passive inductor-capacitor (LC) ladder networks. By exploiting this correspondence, the extensive tables and programs available for LC networks can be used to considerably reduce design effort required to achieve a given filter.

Active ladder filters have certain non-idealities which can affect the performance of switched ladder filters. Among the most significant are the amplifier DC offset voltage accumulation, finite integrating amplifier open loop gain, capacitor ratio errors and parasitics, noise, amplifier frequency response, and instabilities of certain filter configurations. One of these filters configurations is the higher order high pass filter which, due to the finite gain of the amplifiers combined with the near unity gain of the feedback loop, is subject to instability or long settling times. Others have used impedance scaling or element value changes to overcome the stability problem but an easily modeled and implemented solution has not, until now, been achieved.

SUMMARY OF THE INVENTION

Therefore, it is an object of the present invention to avoid instabilities in a switched capacitor high pass filter.

It is a further object of the present invention to extend the instability avoidance to high order switched capacitor filters without excessive loss.

It is a further object of the present invention to maintain low sensitivity to component value variation.

It is a further object of the present invention to introduce phase error compensation in the terminating impedances.

Accordingly, these and other objects are achieved in the present invention which is a high pass switched capacitor filter of third order or greater which has a direct coefficient loop interrupted by a switched-capacitor inductor. The value of this inductor is selected to partially compensate the filter termination phase error.

DETAILED DESCRIPTION OF THE PREFERRED EMBODIMENT

It is desirable in a two-way radio to remove signalling and coded squelch information, transmitted at audio frequencies below 300 Hz, with a high pass filter. A 7 pole filter such as that shown in FIG. 1 has been used to perform this function. This circuit, however, is physically quite large and impractical to be incorporated in smaller radios.

Figure 1:
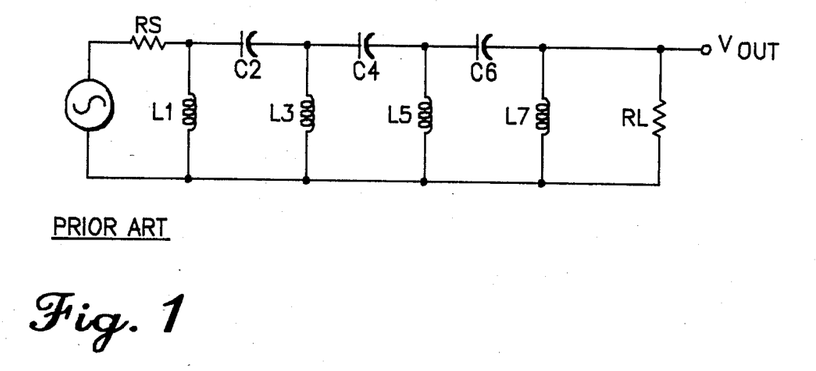
FIG. 1 is a schematic conventional high pass filter.
Figure 2A:
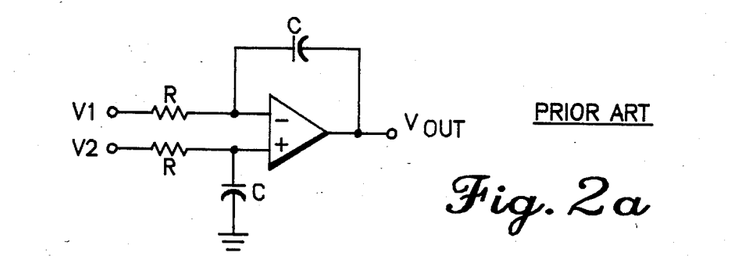
FIG. 2A is a schematic conventional active integrator.
Figure 2B:
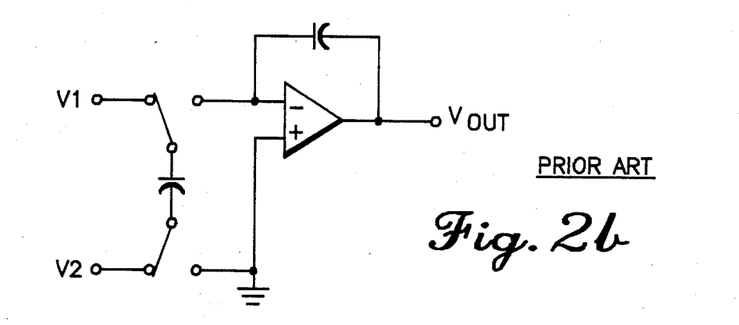
FIG. 2B shows an active integrator schematic employing a switched capacitor element.

It has been shown in the literature that an active integrator such as that of FIG. 2a can be transformed into the switched capacitor integrator of FIG. 2b. It has also been shown that integrators such as that of FIG. 2B may be arranged in a circuit configuration to approximate the desired circuit elements of a filter. Just such a switched capacitor high pass filter is shown in FIG. 3 and is electrically equivalent to the high pass filter shown in FIG. 1.

Figure 3:
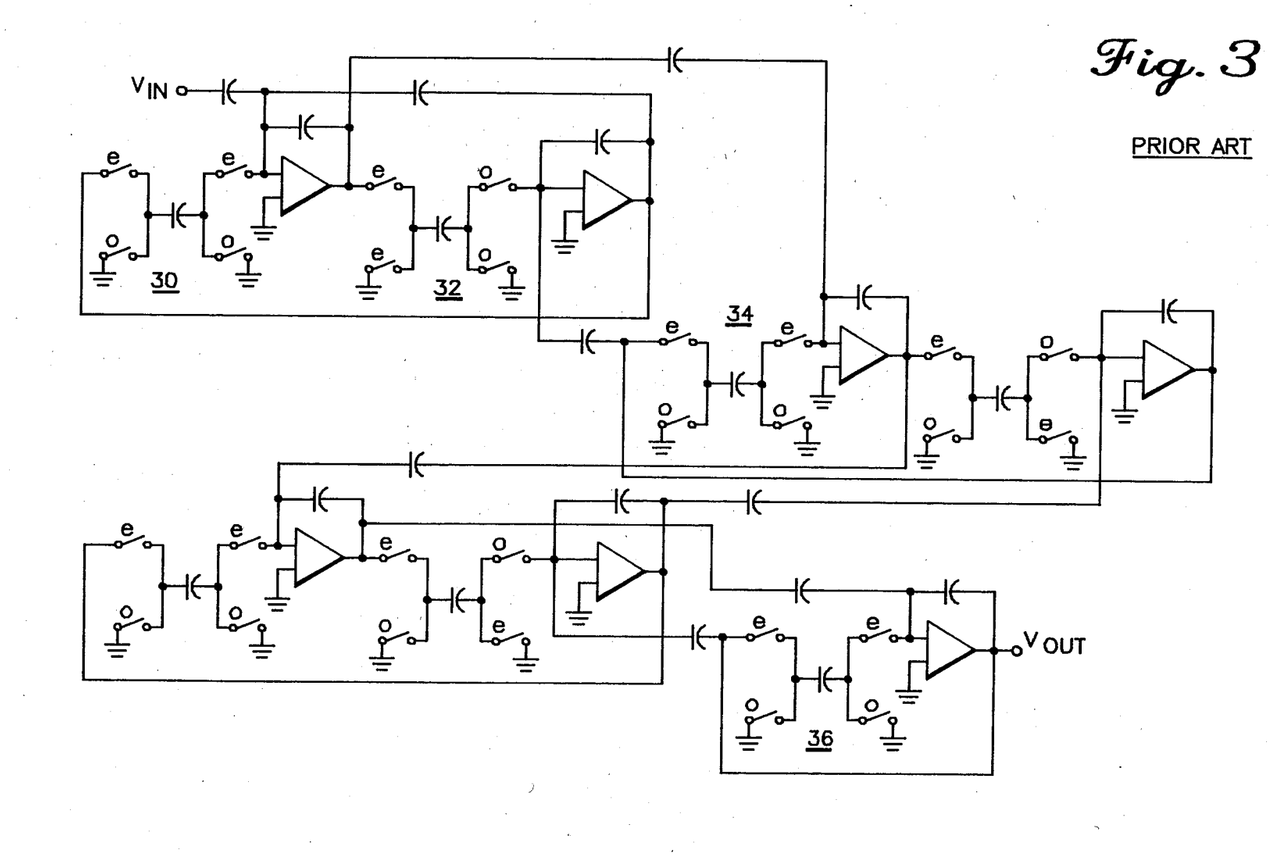
FIG. 3 shows a conventional switched capacitor doubly terminated high pass filter equivalent to that shown in FIG. 1.

An element by element analogy can be made between the switched capacitor implementation of FIG. 3 and the lumped element filter of FIG. 1. For example, the switched capacitor 30 is equivalent to L1 of FIG. 1. Similarly, the switched capacitor 32 is equivalent to C2, switched inductor 34 is equivalent to L3, and so forth through switched inductor 36 equivalent to L7.

There are two phases associated with the switches of the switched capacitor filter, an even (e) and an odd (o) phase. All of the switches marked "e" are closed simultaneously then opened followed by a closure of the switches marked "o". (In the preferred embodiment these switches are implemented by MOS transistor switches).

Figure 4:
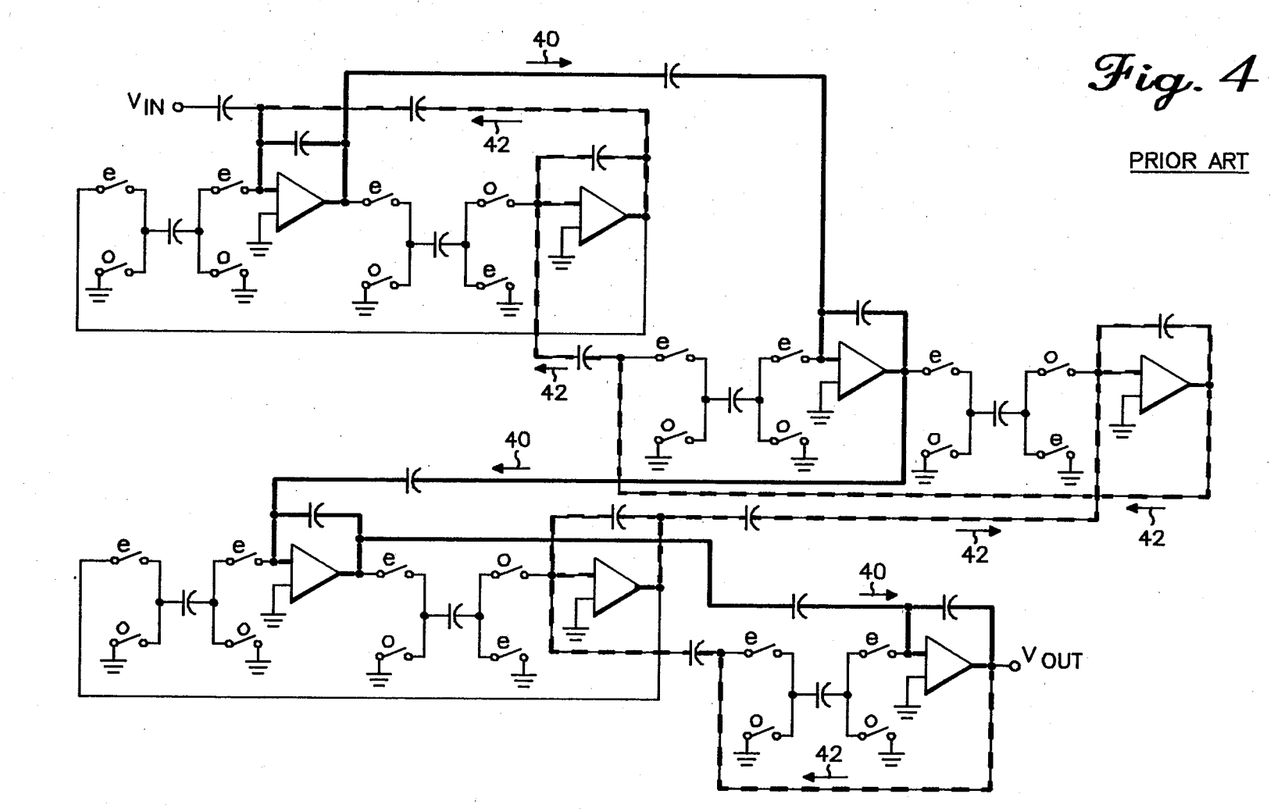
FIG. 4 indicates the direct coefficient feedback loop present in the switched capacitor high pass filter of FIG. 3.

One serious defect which has prevented wide spread usage of higher order switched capacitor high pass filters is filter instability. Real operational amplifiers provide a small amount of signal phase shift which increases as the unity gain frequency is approached. High pass filter designs contain a near unity feedback loop between input and output which, combined with operational amplifier phase shifts, can cause the loop to be unstable or can result in long settling times limiting the maximum filter sampling rate. This loop, which passes through each operational amplifier is shown in FIG. 4. The forward path is diagrammed as 40 and travels from input to output. The return path 42 returns to the input. This loop is known as a direct coefficient loop or delay free loop and connects the first and last operational amplifiers with a continuous (non-sampled) time loop.

This problem will occur for any simulated LC network which capacitively couples the input and the output. However, some elliptic lowpass filters will not have any problems, even when input and output are capacitively coupled because the gain around the loop is much less than one. The coupling capacitors in elliptic lowpass filters are for zeros, rather than poles, of the transfer function. The elliptic filter has been extensively discussed in the literature.

Figure 5:
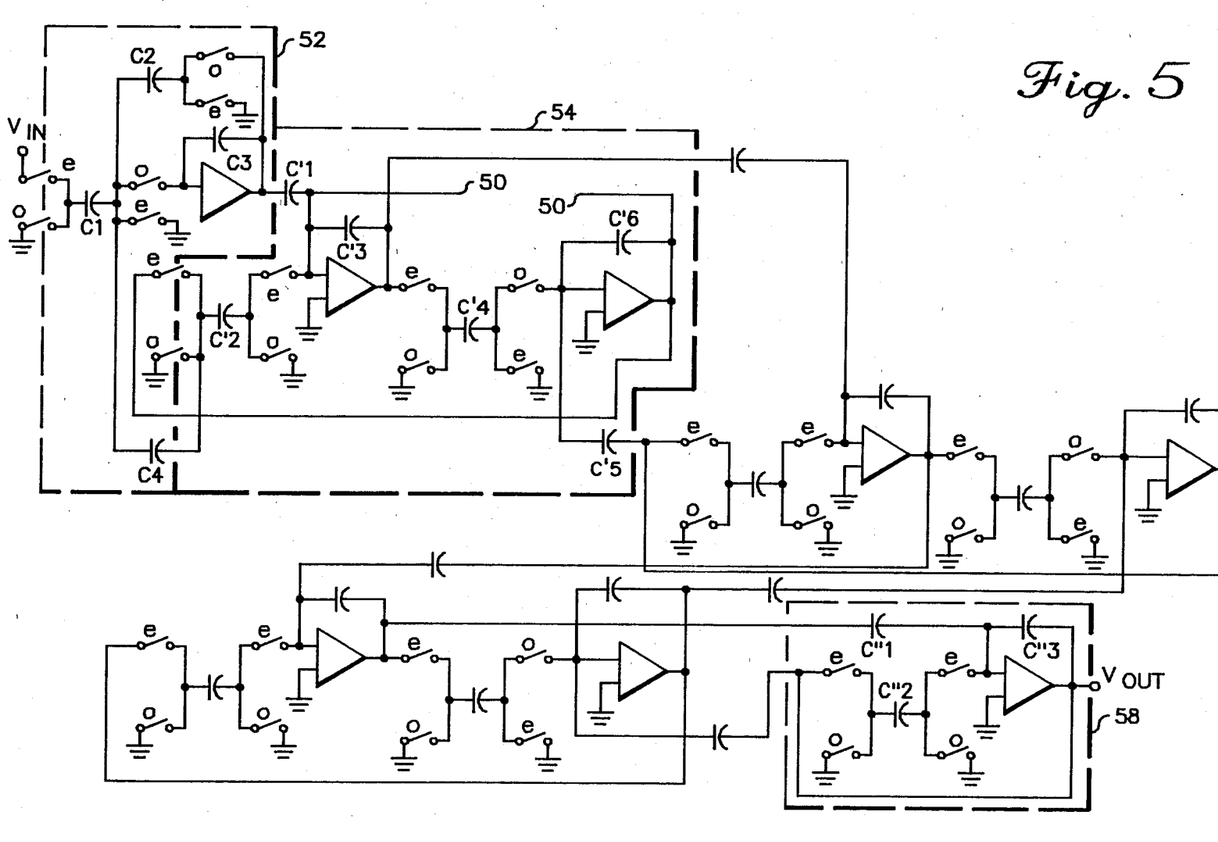
FIG. 5 shows the switched-capacitor high pass filter of the present invention wherein the direct coefficient loop is interrupted by a linear discrete integrator inductor at the filter input.
Figure 6:
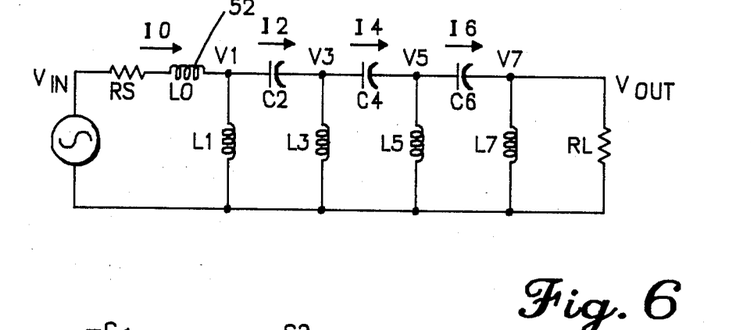
FIG. 6 shows the discrete element equivalent of the switched capacitor filter of the present invention.

To eliminate this problem, the instantaneous coupling between input and output must be interrupted in a manner least disruptive to the filter parameters. The preferred embodiment breaks the direct coefficient loop at the input with a switched capacitor inductor, which causes the input signal to be sampled by the first integrator. If the direct coefficient loop were to be broken elsewhere, the analysis (and hence the synthesis) of the switched capacitor network would become complicated and the interface to other circuits would become more difficult. FIG. 5, then, shows the resulting switched capacitor filter of the present invention using the lossless discrete integrator (LDI) approximation. An equivalent lumped element high pass filter similar to FIG. 1 but indicating the position of the continuous time loop interrupting inductor 52 is shown in FIG. 6. Referring again to FIG. 5, the the location of the added equivalent inductor was chosen to cause the input of the filter to be sampled. Another advantage to the added inductor is a partial compensation for phase error found in the terminating impedances of the switched capacitor lossless discrete integrator approximation. Although complete frequency compensation of the lossless discrete integrator terminations is not always achieved, the desired response over a desired frequency band is obtained. One filter section (equivalent to L1, C2 of FIG. 6) of the three middle stages is shown as section 54 and an output stage, equivalent to L7 of FIG. 6, is shown as stage 58.

In order to design a switched capacitor filter for the particular application of the present invention, a traditional high pass filter model is used (FIG. 1). The inductor 52 equivalent of the LDI inductor must be considered in the defining equations which are derived from a mathematical analysis of FIG. 6:

$$V_7 = \frac{-R_L}{SL_7} V_7 + R_L I_6 = R_L \left( I_6 - \frac{V_7}{SL_7} \right) = R_L(I_6 - I_{L7})$$

$$I_6 = \frac{1}{SL_7} V_7 + \frac{V_7}{R_L} = -\frac{1}{SL_5} V_5 + I_4$$

$$V_5 = \frac{1}{SC_6} I_6 + V_7$$

$$I_4 = \frac{1}{SL_5} V_5 + I_6 = -\frac{1}{SL_3} V_3 + I_2$$

$$V_3 = \frac{1}{SC_4} I_4 + V_5$$

$$I_2 = \frac{1}{SL_3} V_3 = I_4 = -\frac{1}{SL_1} V_1 + I_0$$

$$V_1 = \frac{1}{SC_2} I_2 + V_3$$

$$I_0 = \frac{1}{SL_1} V_1 + I_2 = \frac{1}{SL_0} (V_{IN} - R_S I_0 - V_1)$$

$$V_{IN} = R_S I_0 + SL_0 I_0 + V_1$$

Figure 7:
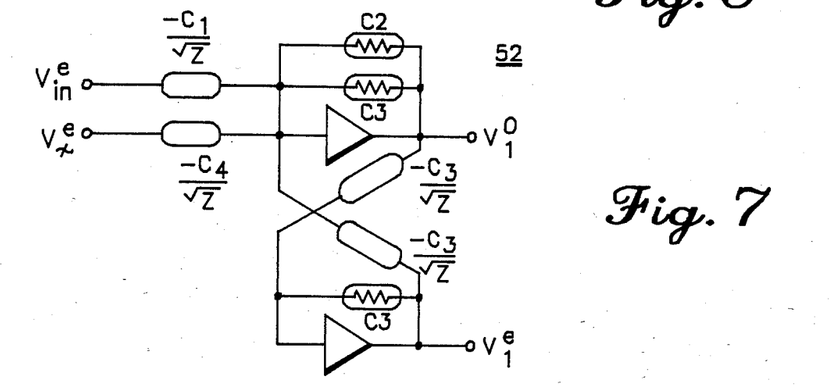
FIG. 7 shows the essential Z-domain conductance elements of the input inductor.

Thus, the network represented by these equations can be configured in switched capacitor form as shown in FIG. 5 and subsequently reduced to Z-domain conductance elements after substitution and after conductances between voltage sources, operational amplifier virtual grounds, and operational amplifier outputs have been removed. The equivalent circuit for input inductor circuit 52 is shown in FIG. 7. After writing the two node equations at the even and odd operational amplifier inputs, the following result is obtained when the LDI approximation Z-transform is used:

$$LDI \text{ approximation} = \hat{Z}^{-1} = \frac{Z^{-\frac{1}{2}}}{1 - Z^{-1}}$$

$$V_1^o = -\frac{C_2}{C_3} \frac{(1)}{(1 - Z^{-1})} V_1^o + \frac{C_4}{C_3} \frac{(Z^{-\frac{1}{2}})}{(1 - Z^{-1})} V_x^e + \frac{C_1}{C_3} \frac{(Z^{-\frac{1}{2}})}{(1 - Z^{-1})} V_{in}^e$$

$$V_1^e = Z^{-\frac{1}{2}} V_1^o$$

where $V_x^e$=feedback voltage from following stage and $V_1$ and $V_{in}$ are shown in FIG. 5. (Superscripts "o" and "e" correspond to odd and even closings respectively of switches so designated).

Figure 8:
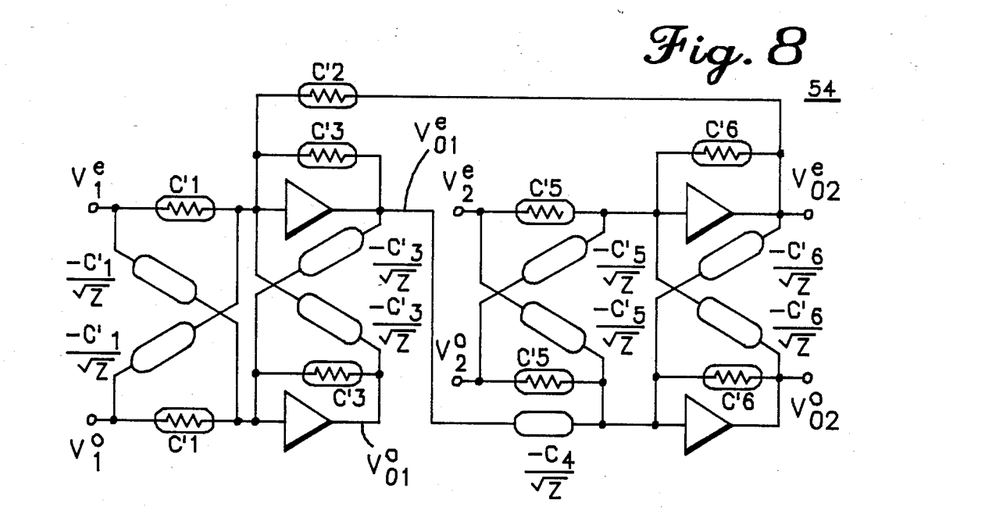
FIG. 8 shows the essential Z-domain conductance elements of a two-pole filter section.

The first of the three middle stages 54 in FIG. 5 reduced to Z-domain conductance elements as shown in FIG. 8 and can be written as:

$$V_{o1}^e = -\frac{C_1}{C_3} V_1^e - \frac{C_2}{C_3} \frac{(1)}{(1 - Z^{-1})} V_{o2}^e$$

-continued $$V^o_{01} = -\frac{C_1}{C_3} V_1^o - \frac{C_2}{C_3} \frac{(Z-\frac{1}{2})}{(1-Z^{-1})} V^e_{o2}$$

$$V^e_{02} = -\frac{C_5}{C_6} V_2^e + \frac{C_4}{C_6} \frac{(Z-1)}{(1-Z^{-1})} V^e_{o1}$$

$$V^o_{02} = -\frac{C_5}{C_6} V_2^o + \frac{C_4}{C_6} \frac{(Z-\frac{1}{2})}{(1-Z^{-1})} V^e_{o1}$$

where the variables are as shown in FIG. 5. (Superscripts "o" and "e" correspond to odd and even closings respectively of switches so designated).

Figure 9:
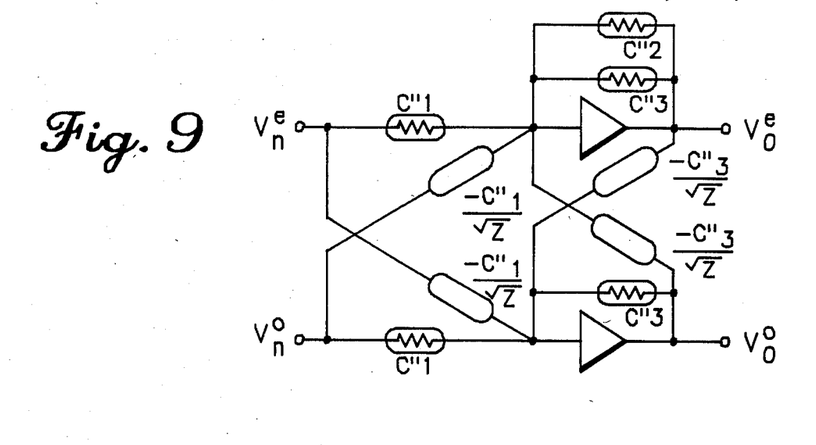
FIG. 9 shows the essential Z-domain conductance elements of the output of the filter.

Identical equations may be derived for the second and third stages and need not be reproduced here. The transformation of the output stage 58 of the filter yields a transform circuit represented by FIG. 9 and equations as follows:

$$V^e_{out} = -\frac{C''_2}{C''_3} \frac{(1)}{(1-Z^{-1})} V^e_{out} - \frac{C''_1}{C''_3} V_n^e$$

$$V^o_{out} = -\frac{C''_2}{C''_3} \frac{(Z-\frac{1}{2})}{(1-Z^{-1})} V^e_{out} - \frac{C''_1}{C''_3} V_n^o$$

where the variables are as shown in FIG. 5. (Superscripts "o" and "e" correspond to odd and even closings respectively of switches so designated).

Figure 10A:
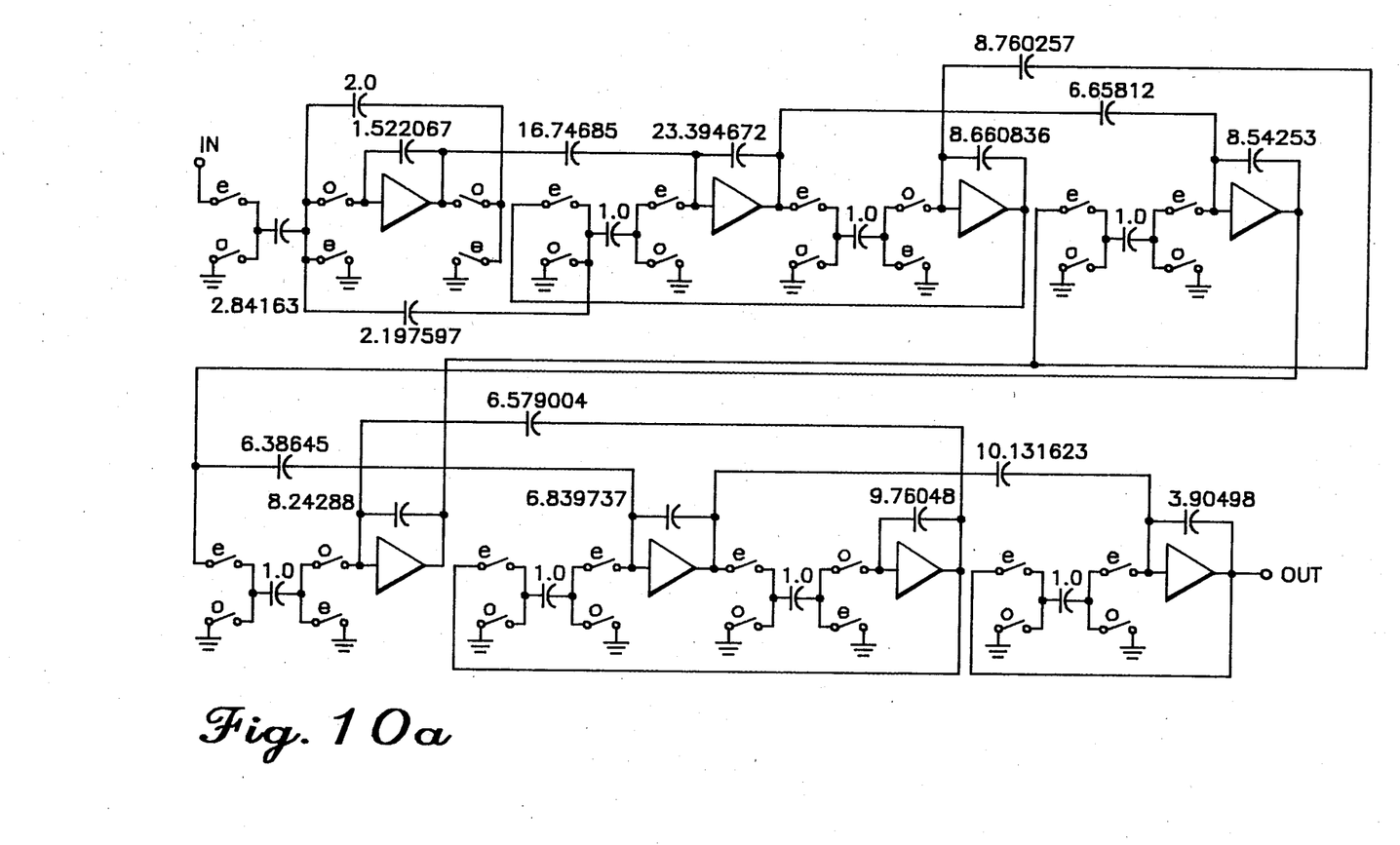
FIG. 10a shows a practical realization of the equivalent circuit of FIG. 5.
Figure 10B:
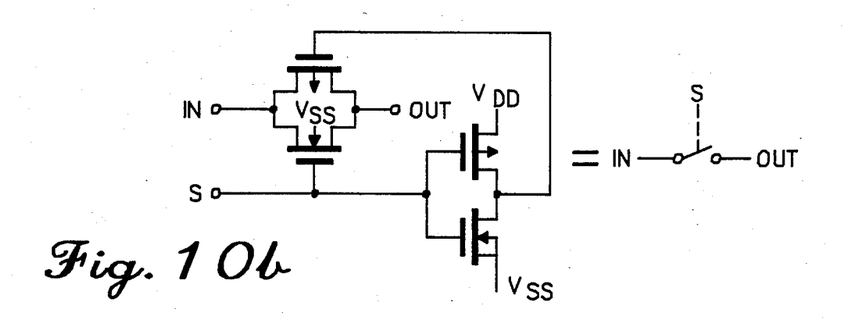
FIG. 10b shows the MOS transistor realization of one switch.
Figure 11:
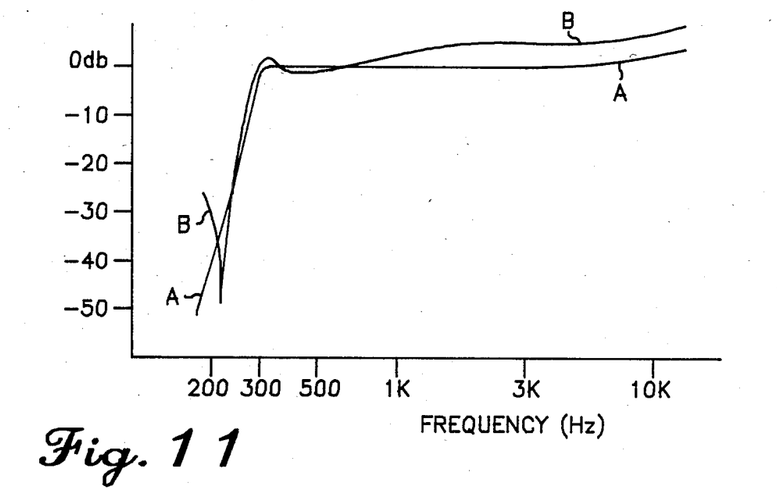
FIG. 11 is a frequency versus amplitude graph of the frequency response of the realized circuit.

When these sets of equations are solved for a filter having a cutoff frequency of 300 Hz, a switched capacitor filter having component values as shown in FIG. 10a is realized. The capacitance values are given in normalized integrated design units equal to approximately 0.5 pF in the preferred embodiment. The switch cells are realized with MOS transistors in a standard SPST arrangement as shown in FIG. 10b. The filter of the preferred embodiment has a frequency response as shown in FIG. 11 when constructed with the aforementioned values. Due to the even and odd time paths through the filter, there are actually two transfer functions associated with the output. The correct response is obtained by sampling the output of the filter during the even time to obtain the response as shown by curve A. The odd sample path (curve B) is ignored during the non-sampled time of the next circuit.

While a particular embodiment of the filter according to the invention has been shown and described, it should be understood that the invention is not limited thereto since many modifications may be made. Any S-domain to Z-domain transformation (e.g. by linear transform) circuit having an instantaneous coupling loop and sufficient gain and phase shift will benefit by this invention. It is therefore comtemplated to cover by the present application any and all such modifications that fall within the true spirit and scope of the basic underlying principles disclosed and claimed herein.

I claim:

1. A switched capacitor high pass filter having an input and an output, comprising:
    at least one high pass filter stage having at least two amplifiers, each amplifier having an input and an output port, said output port of a first amplifier coupled to said input port of a second amplifier via a first switched capacitor network and said output port of said second amplifier coupled to said input port of said first amplifier via a second switched capacitor network;
    an active output stage having an input and an output port, said output port coupled to the output of the switched capacitor filter;
    a first delay free coupling means from said output port of said first amplifier of said at least one high pass filter stage to said input port of said output stage, thereby creating a delay free coupling from said input port of said first amplifier to said output port of said output stage;
    a second delay free coupling means from said output port of said output stage to said input port of said second amplifier of said at least one high pass filter stage; and
    a switched capacitor inductor coupled between the input of the switched capacitor high pass filter and said input port of said first amplifier in a first one of said at least one high pass filter stage.

2. A switched capacitor high pass filter in accordance with claim 1 wherein said switched capacitor inductor is a lossless discrete integrator.

* * * * *